United States Patent
Toda

(10) Patent No.: US 6,607,112 B2
(45) Date of Patent: Aug. 19, 2003

(54) WIRE BONDING APPARATUS

(75) Inventor: Yasushi Toda, Tokyo (JP)

(73) Assignee: NEC Corporation, Tokyo (JP)

( * ) Notice: Subject to any disclaimer, the term of this patent is extended or adjusted under 35 U.S.C. 154(b) by 78 days.

(21) Appl. No.: 09/919,860

(22) Filed: Aug. 2, 2001

(65) Prior Publication Data

US 2002/0014512 A1 Feb. 7, 2002

(30) Foreign Application Priority Data

Aug. 7, 2000 (JP) .................................... 2000-239126

(51) Int. Cl.⁷ ................................................. B23K 1/06
(52) U.S. Cl. ..................................................... 228/4.5
(58) Field of Search ..................... 228/4.5, 102, 110.1, 228/1.1; 700/160, 170; 29/850, 745, 33 F

(56) References Cited

U.S. PATENT DOCUMENTS 4,200,393 A * 4/1980 Suzuki et al. ................... 228/9
5,156,318 A * 10/1992 Suzuki et al. ................ 228/4.5
5,251,805 A * 10/1993 Tani et al. .................... 228/1.1
5,400,503 A * 3/1995 Komoriya et al. ........... 228/4.5

FOREIGN PATENT DOCUMENTS

JP        6-310556        10/1994

* cited by examiner

*Primary Examiner*—Tom Dunn
*Assistant Examiner*—Jonathan Johnson
(74) *Attorney, Agent, or Firm*—Sughrue Mion, PLLC

(57) ABSTRACT

There is provided a wire bonding apparatus operated steadily at a high speed without excitation of vibrations of an XY stage 102 and a capillary 104, which are movable parts. The wire bonding apparatus is configured so as to have a composite target path generating section 208 for generating a target path 109, in which the deceleration part of a go path and the acceleration part of a return path are composed to one continuous path, for a path part of reciprocating movement of said target path indicating a motion process of either one or both of the XY stage and capillary.

6 Claims, 6 Drawing Sheets

WIRE BONDING APPARATUS

BACKGROUND OF THE INVENTION

1. Field of the Invention

The present invention relates to a wire bonding apparatus and, more particularly, to target path generating means for generating a target path indicating a motion process of an XY stage and a capillary.

2. Description of Related Art

FIG. 1 is a block diagram of a conventional wire bonding apparatus. In FIG. 1, an XY stage 102 is driven in an X-axis direction horizontally and in a Y-axis direction horizontally by an XY drive motor 101 to move a capillary 104 in the X-axis direction horizontally and in the Y-axis direction horizontally. The capillary 104 is driven in a Z-axis direction vertically by a Z-axis drive motor 103. Also, sensors, not shown, are disposed on the X-, Y-, and Z-axes so that the positions of the XY stage 102 on the X- and Y-axes and the position of the capillary 104 on the Z-axis can be detected. A servo computation section 105 is provided, which reads position signals X, Y and Z obtained by the sensors, and computes and outputs proper driving force signals 106a, 106b and 106c to follow a target path 109. The target path 109 is generated and outputted by a target path generating section 108, described later, to indicate each motion process of the XY stage 102 and the capillary 104. Amplifiers 107a, 107b and 107c are provided for amplifying the driving force signals 106a, 106b and 106c, respectively, and for supplying the amplified signals to the XY drive motor 101 and the Z-axis drive motor 103. By the output signals sent from the amplifiers 107a, 107b and 107c, the XY stage 102 and the capillary 104 are driven according to the target path 109, by which wire bonding is performed between an electrode on a semiconductor chip and a package lead.

The target path 109 for the XY stage 102 and the capillary 104 can be generated by various methods. Theoretically, the path for driving at the highest speed is a rectangular path by the input of the fastest acceleration. In the case where a fixed driving force is supplied, however, since the driving force signals 106a, 106b and 106c contain high-frequency components in large amounts, a vibration mode existing in the XY stage 102 and the capillary 104 is excited, which causes a problem in that much time is taken until vibrations cease. Also, there arises a problem in that the vibrations cause poor bonding.

To cope with such problems, the art described in Japanese Laid Open Patent Publication No. 6-310556 uses a cycloid path (sinusoidal path) to generate the target path 109. When such a path is used, the driving force signals 106a, 106b and 106c are composed of a single frequency component only, so that there is less possibility of exciting the vibration mode existing in the XY stage 102 and the capillary 104. Therefore, the target path 109 can be followed steadily. With this method, however, when the drive speed of the bonding apparatus is increased, the period of a sinusoidal wave used for the path is shortened, so that the vibration mode of the XY stage 102 and the capillary 104 is excited. Therefore, there is a possibility of causing the same problems as described above.

Also, for the wire bonding apparatus, the XY stage 102 and the capillary 104 are mainly subjected to reciprocating motion because of their characteristics. Conventionally, however, the target path has been prepared individually for each motion. Therefore, if the period of a sinusoidal wave used for an acceleration path is short, there is a possibility of exciting the vibration mode of the XY stage 102 and the capillary 104.

As described above, the conventional wire bonding apparatus has a problem in that when an increased speed of the apparatus is attained, the vibration mode of the XY stage and capillary is excited, so that the stability is impaired.

SUMMARY OF THE INVENTION

Therefore, an object of the present invention is to provide a wire bonding apparatus operated steadily at a high speed without excitation of vibrations of an XY stage and a capillary, which are movable parts.

To achieve the above object, the invention of a first mode is characterized in that in a wire bonding apparatus which has an XY axis driving mechanism and a Z axis driving mechanism for driving an XY stage and a capillary, respectively, and connects a wire between an electrode on a semiconductor chip and a wiring layer or a lead of a package by controlling the XY stage and capillary so that they go along a target path specified in advance. The apparatus comprises composite target path generating means for generating the target path, in which the deceleration part of a go path and the acceleration part of a return path are one continuous path, for a path part of reciprocating movement of the target path indicating a motion process of either one or both of the XY stage and capillary.

The invention of a second mode is characterized in that in the wire bonding apparatus of the first mode, the composite target path generating means generates the target path, in which the deceleration part of the go path and the acceleration part of the return path for the path part of the reciprocating movement is one continuous path so that the fastest acceleration is within the fastest acceleration that can be produced by the XY axis driving mechanism and Z axis driving mechanism.

The invention of a third mode is characterized in that in the wire bonding apparatus of the first mode, the composite target path generating means generates the target path, in which the deceleration part of the go path and the acceleration part of the return path are one continuous path for the path part of the reciprocating movement so that the fastest acceleration does not exceed the fastest acceleration that can be produced by the XY axis driving mechanism and Z axis driving mechanism, and that the acceleration period of the target path is within the time specified in advance.

The invention of a fourth mode is characterized in that in the wire bonding apparatus of the first, second, or third mode, the target path is a target acceleration path, target velocity path, and target position path.

The invention of a fifth mode is characterized in that in the wire bonding apparatus of the fourth mode, the target acceleration path is a cycloid path of a sinusoidal wave.

The invention of a sixth mode is characterized in that in the wire bonding apparatus of the fourth mode, the target acceleration path is a rectangular wave path.

The invention of a seventh mode is characterized in that in the wire bonding apparatus of the fourth mode, the target acceleration path is a triangular wave path.

The invention of a eighth mode is characterized in that in the wire bonding apparatus of the fourth mode, the target acceleration path is a continuous path formed by a combination of two or more paths of the cycloid path, rectangular wave path, and triangular wave path.

DETAILED DESCRIPTION OF THE PREFERRED EMBODIMENTS

Figure 1:
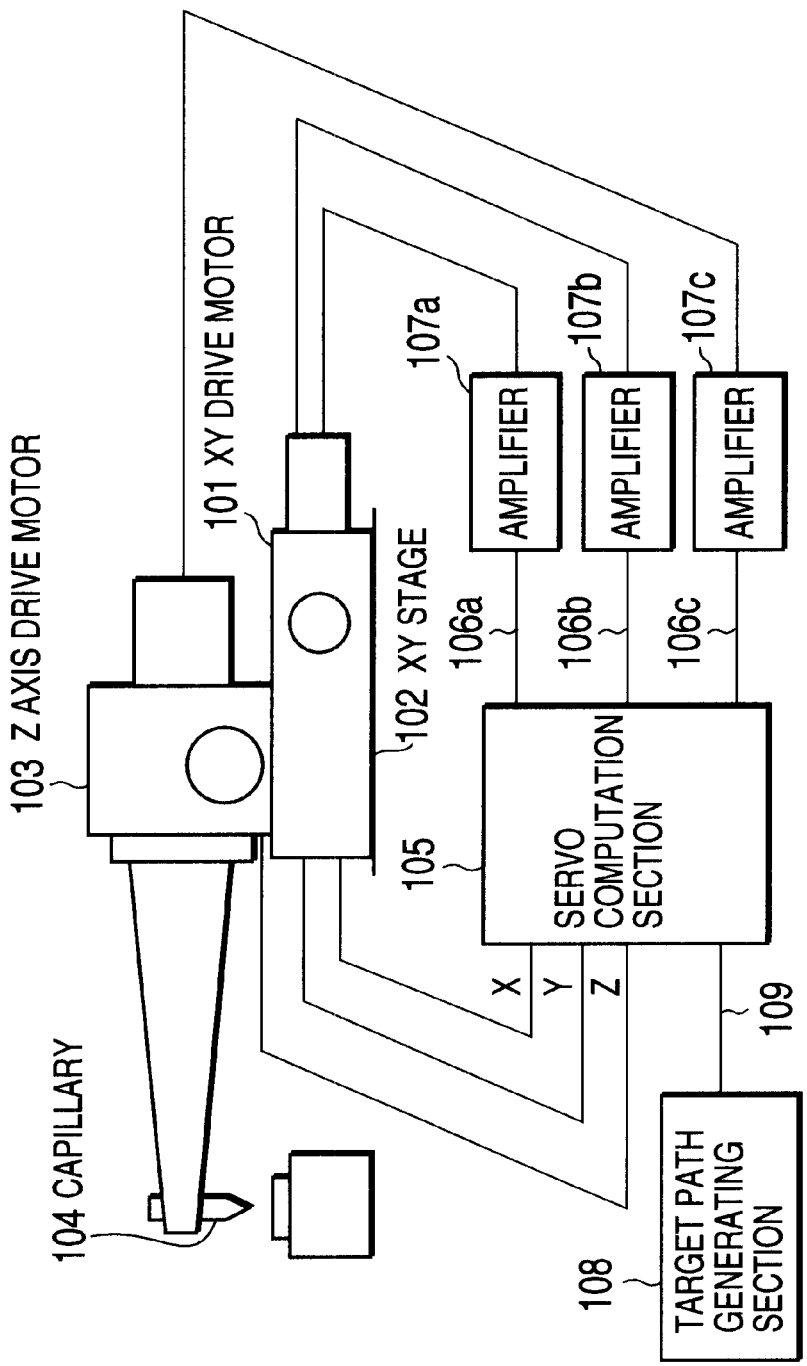
FIG. 1 is a block diagram showing a configuration of a conventional wire bonding apparatus.

A wire bonding apparatus in accordance with embodiments of the present invention will now be described with reference to FIG. 2. FIG. 2 is a block diagram of a wire bonding apparatus in accordance with the first to fifth embodiments. As mentioned above in FIG. 1, an apparatus of the present invention in FIG. 2 is also provided an XY stage 102 driven in an X-axis direction horizontally and in a Y-axis direction horizontally by an XY drive motor 101 to move a capillary 104 in the X-axis direction horizontally and in the Y-axis direction horizontally. The capillary 104 is driven in a Z-axis direction vertically by a Z-axis drive motor 103. Also, sensors, not shown, are disposed on the X-, Y-, and Z-axes so that the positions of the XY stage 102 on the X- and Y-axes and the position of the capillary 104 on the Z-axis can be detected. A servo computation section 105 is provided, which reads position signals X, Y and Z obtained by the sensors, and computes and outputs proper driving force signals 106a, 106b and 106c to follow a target path 109. The target path 109 indicates each motion process of the XY stage 102 and the capillary 104. Amplifiers 107a, 107b and 107c are provided for amplifying the driving force signals 106a, 106b and 106c, respectively, and for supplying the amplified signals to the XY drive motor 101 and the Z-axis drive motor 103. By the output signals sent from the amplifiers 107a, 107b and 107c, the XY stage 102 and the capillary 104 are driven according to the target path 109, by which wire bonding is performed between an electrode on a semiconductor chip and a package lead.

Figure 2:
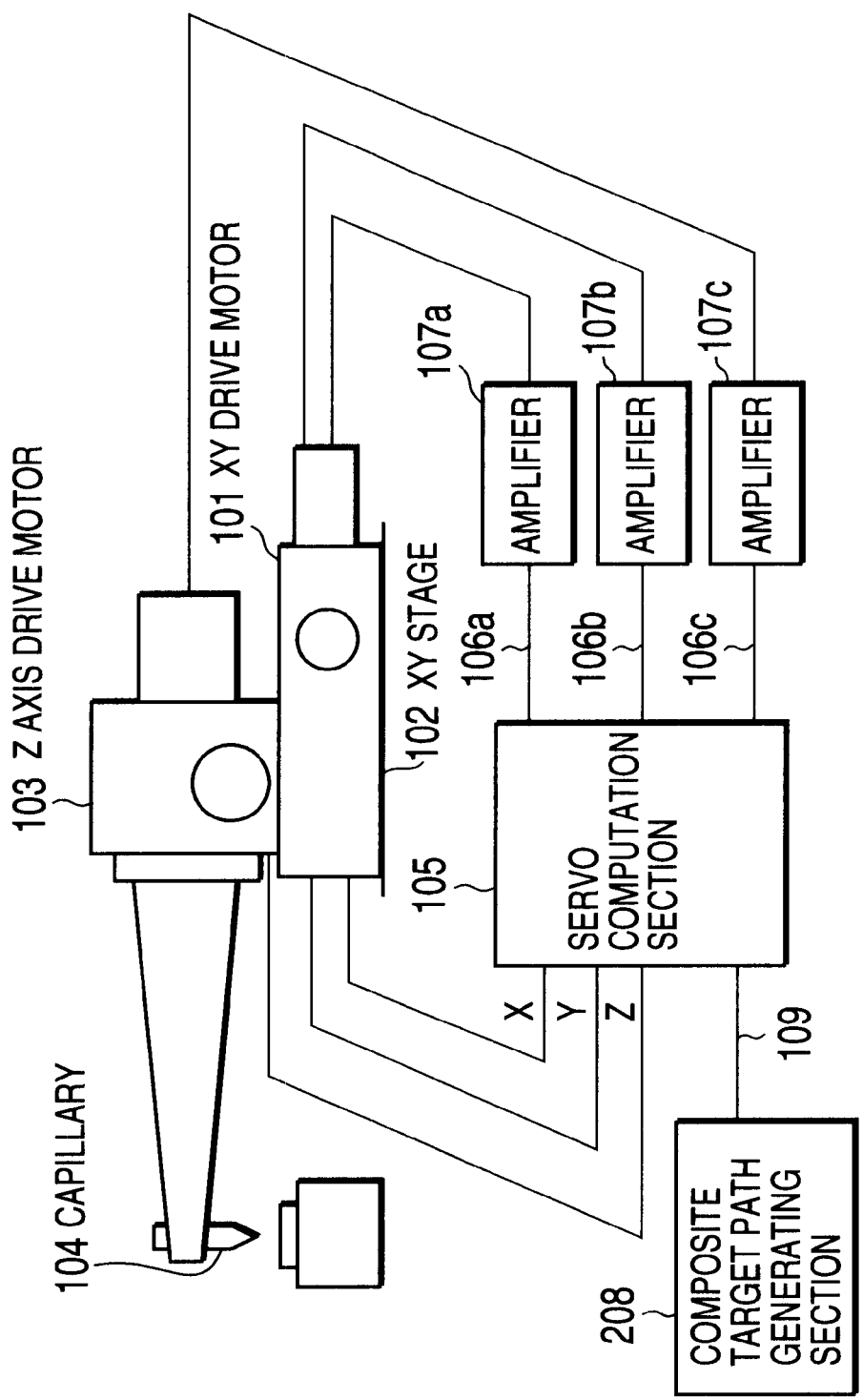
FIG. 2 is a block diagram showing a configuration of a wire bonding apparatus in accordance with first to fifth embodiments of the present invention.

FIG. 2 of the present invention differs from FIG. 1 of the prior art in that a composite target path generating section 208 is provided in place of the target path generating section 108 shown in FIG. 1. In FIG. 2, the composite target path generating section 208, which generates a target path 109 indicating the motion process of an XY stage 102 and a capillary 104, is different, as described later, from the target path generating section 108 in FIG. 1 of the prior art in the method for generating the target path 109.

Figure 3:
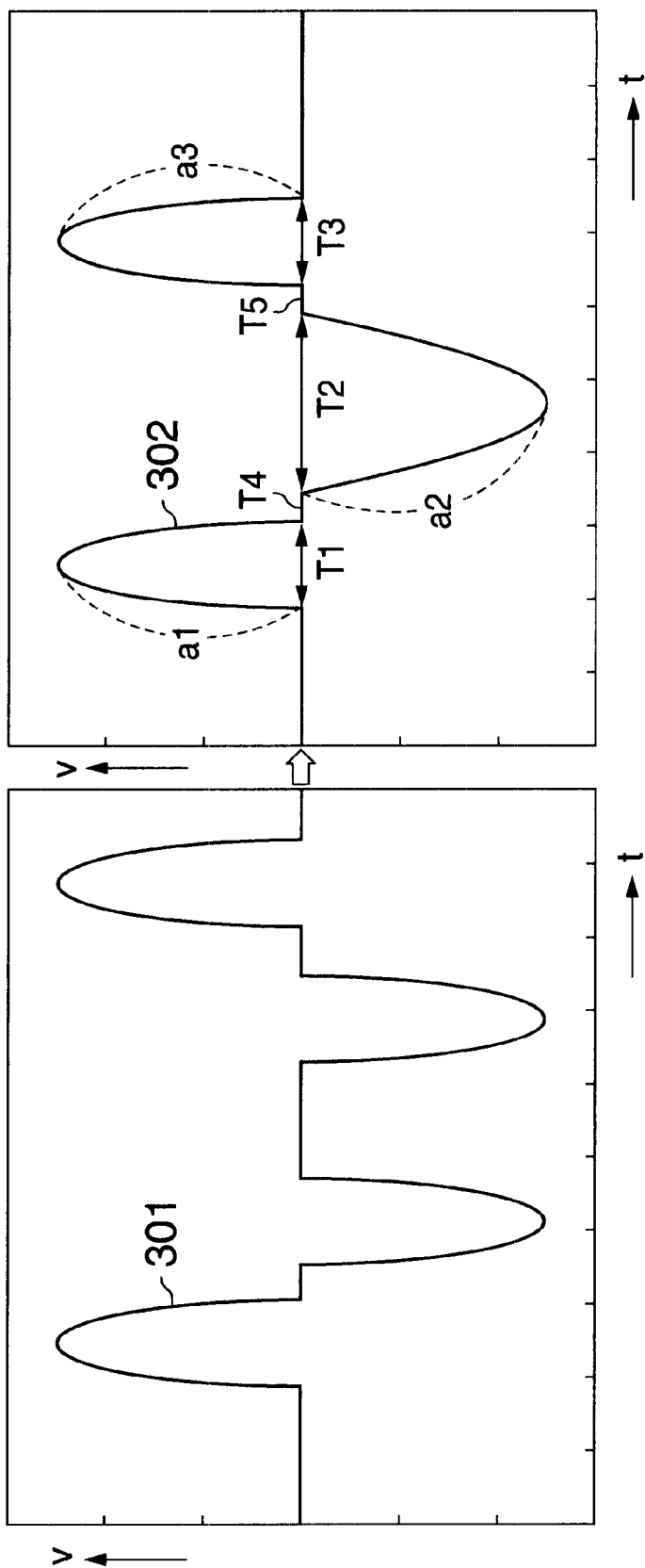
FIG. 3 is a chart showing an example of path composition in a composite target path generating section of a wire bonding apparatus in accordance with the first embodiment.

Next, the composite target path generating section 208 in accordance with an embodiment of the present invention will be described with reference to FIGS. 2 and 3. FIG. 3 is a chart showing a composite target acceleration path 302 generated by the composite target path generating section 208 of this embodiment. FIG. 3 shows, as an example, the composite target acceleration path 302 of a part of reciprocating motion in the motion process of the XY stage 102 or the capillary 104. The composite target path generating section 208 is configured so that a deceleration path of a go part and an acceleration path of a return part on a target acceleration path 301, which is a sinusoidal path (cycloid path) used as the reference, are outputted as a composite path as indicated by the composite target acceleration path 302.

Specifically, the composite target path generating section 208 defines the position, velocity and acceleration of a go path start point, the position, velocity and acceleration of a go path end point (return path start point), and the position, velocity and acceleration of a return path end point as constraint conditions, sets the fastest accelerations a1, a2 and a3 on the composite target acceleration path so as to be within the fastest acceleration that can be produced by the wire bonding apparatus, and calculates times T1, T2, T3, T4 and T5. Then, the composite target path generating section 208 calculates the composite target acceleration path 302 by using the calculated times T1, T2, T3, T4 and T5. Also, a composite target velocity path and a composite target position path are obtained from a function obtained by integrating the composite target acceleration path 302 in advance or by directly implementing integration. The composite target path generating section 208 outputs the composite target acceleration path 302, the composite target velocity path, and the composite target position path, which have been obtained by the calculation, as the target path 109.

Figure 4:
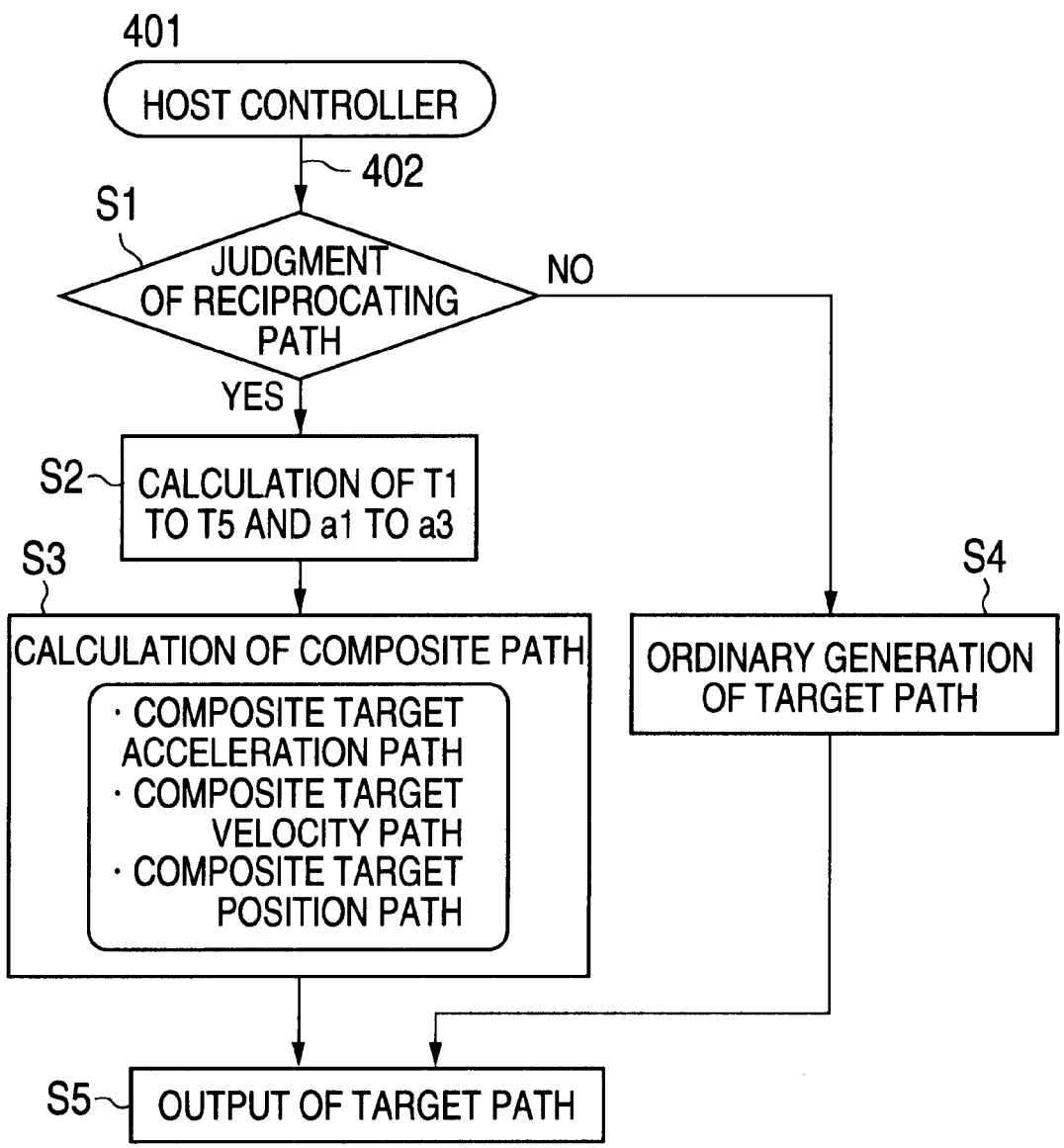
FIG. 4 is a flowchart showing a procedure for generating a path in a composite target path generating section of a wire bonding apparatus in accordance with the first to fifth embodiments.

Next, the operation of this embodiment will be described with reference to FIG. 4. FIG. 4 is a flowchart showing a procedure for generating a composite path in the composite target path generating section 208. In FIG. 4, upon receipt of a movement command 402 for the XY stage 102 and the capillary 104 from a host controller 401, the composite target path generating section 208 judges, based on the movement command 402, whether or not the movement is a reciprocating movement (Step S1).

If the movement command 402 is not of a reciprocating movement, as in the case of the conventional path generation, the target acceleration path, the target velocity path, and the target position path are generated using the cycloid path according to the motion process and movement distance (Step S4), and these paths are outputted as the target path 109 (Step S5).

On the other hand, if the movement command 402 is of a reciprocating movement, the position, velocity and acceleration of a go path start point, the position, velocity and acceleration of a go path end point (return path start point), and the position, velocity and acceleration of a return path end point are defined as constraint conditions, the fastest accelerations a1, a2 and a3 on the composite target acceleration path are set so as to be within the fastest acceleration that can be produced by the wire bonding apparatus, and times T1, T2, T3, T4 and T5 are calculated (Step S2). Then, the composite target acceleration path 302, the composite target velocity path, and the composite target position path are calculated by using the calculated times T1, T2, T3, T4 and T5 (Step S3), and these paths are outputted as the target path 109 (Step S5). By accomplishing the above-described operation, the target path 109 for reciprocating movement can be set so as to increase the period of the cycloid path used for the composite target acceleration path 302 while the required time until the end of path is shortened. Thereby, a vibration mode of the XY stage 102 and the capillary 104 is made less liable to be excited, and high-speed movement can be made possible.

Next, the second embodiment of the present invention will be described with reference to FIGS. 2 and 4. The block configuration of the wire bonding apparatus and the procedure for generating the target path by using the composite target path generating section 208 of this embodiment and the later-described third and subsequent embodiments are the same as the block configuration of the first embodiment shown in FIG. 2 and the procedure shown in the flowchart of FIG. 4, so that the explanation thereof is omitted. This embodiment and the later-described third and subsequent embodiments differ from the first embodiment in the processing details in Steps S2 and S3 shown in FIG. 4.

Specifically, in FIG. 4, in the path generating method of the composite target path generating section 208, if the movement command 402 is of a reciprocating movement (Step S1), the position, velocity and acceleration of a go path start point, the position, velocity and acceleration of a go path end point (return path start point), and the position, velocity and acceleration of a return path end point are defined as constraint conditions, and times T1, T2, T3, T4 and T5 and the fastest accelerations a1, a2 and a3 are calculated so that the times T1, T2, T3, T4 and T5 are within the time range specified in advance and the fastest accelerations a1, a2 and a3 are a value not higher than the fastest acceleration that can be produced by the wire bonding apparatus (Step S2). Then, the composite target acceleration path, the composite target velocity path, and the composite target position path are calculated by using the calculated times T1, T2, T3, T4 and T5 (Step S3), and these paths are outputted as the target path 109 (Step S5). By accomplishing the above-described operation, the period of the target acceleration path can be kept within a given range, so that the vibration mode of the XY stage 102 and the capillary 104 does not occur, and the target path 109 can be generated at a high speed.

Figure 5:
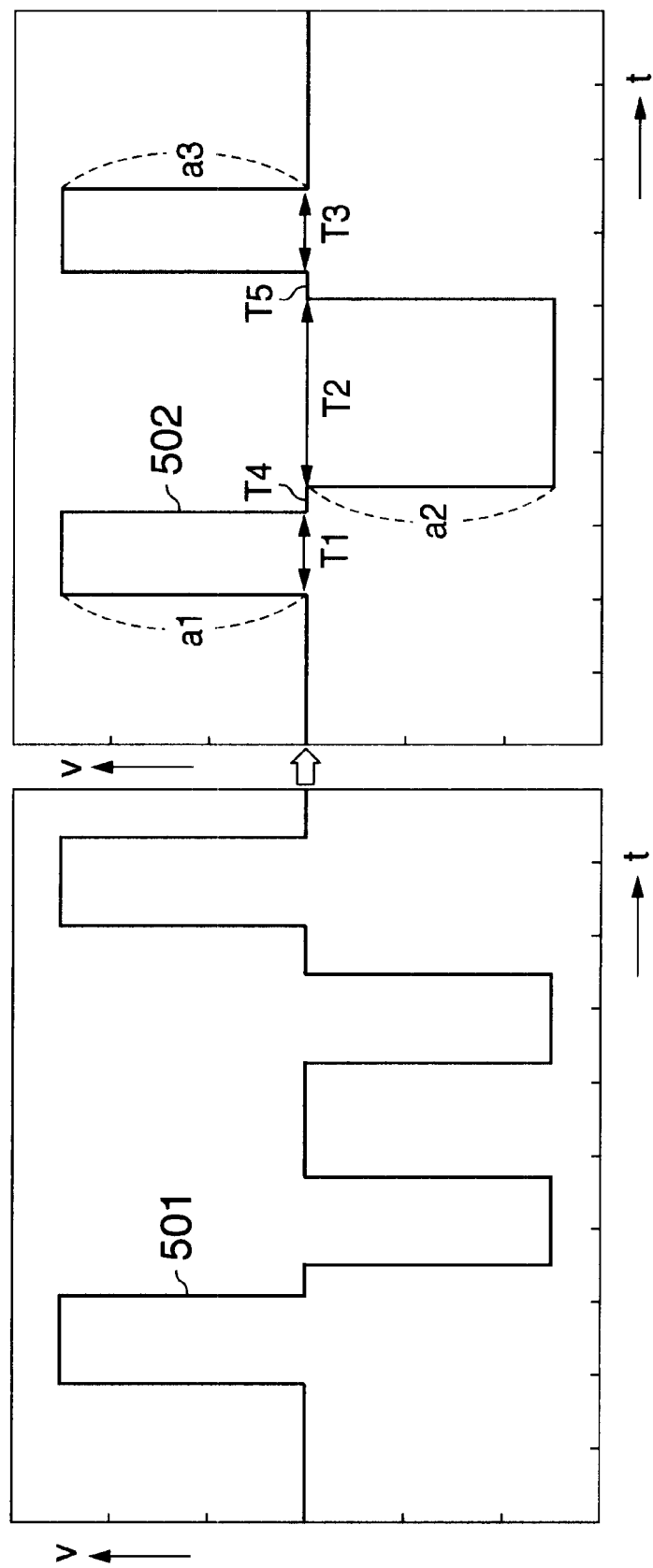
FIG. 5 is a chart showing an example of path composition in a composite target path generating section of a wire bonding apparatus in accordance with the third embodiment.

Next, the third embodiment of the present invention will be described with reference to FIGS. 4 and 5. This embodiment differs from the first and second embodiments in the processing details in Steps S2 and S3 shown in FIG. 4. FIG. 5 is a chart showing a composite target path 502 generated by the composite target path generating section 208 of this embodiment. In FIG. 5, a target acceleration path 501 used as the reference is a rectangular path. As in the cases of the first and second embodiments, the acceleration, velocity and position at the start time, at the end time of a go path, and at a end time of a return path, respectively, are defined as constraint conditions, and times T1, T2, T3, T4 and T5 and the fastest accelerations a1, a2 and a3 are calculated. Then, the composite acceleration path 502 is generated by using the calculated times T1, T2, T3, T4 and T5 and fastest accelerations a1, a2 and a3. A composite target velocity path and a composite target position path are obtained from a function obtained by integrating the composite target acceleration path 502 in advance or by directly implementing integration. The composite target path generating section 208 outputs the composite target acceleration path 502, the composite target velocity path, and the composite target position path, which have been obtained by the calculation, as the target path 109. By the configuration as described above, even if the reference path is a rectangular path, the composite paths of a reciprocating movement part are calculated, so that the target path can be generated at a high speed.

Figure 6:
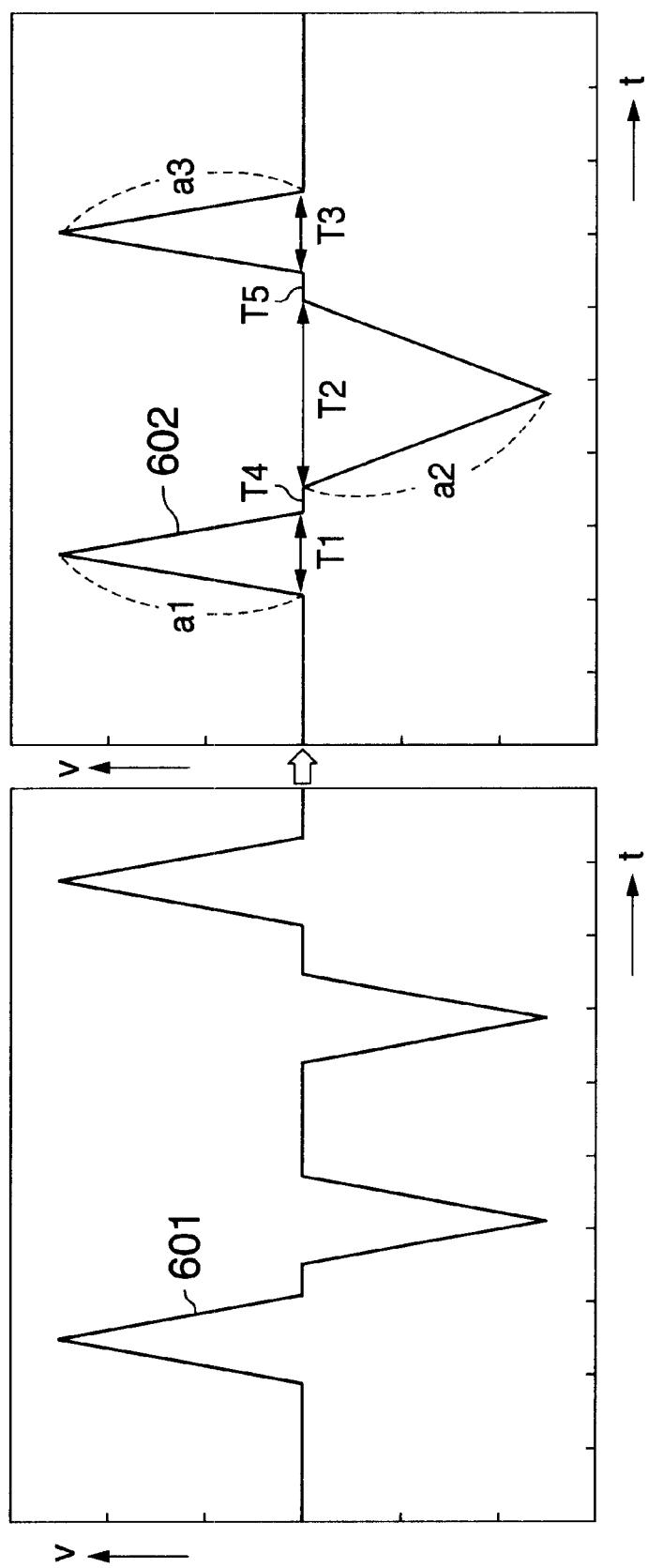
FIG. 6 is a chart showing an example of path composition in a composite target path generating section of a wire bonding apparatus in accordance with the fourth embodiment.

Next, the fourth embodiment of the present invention will be described with reference to FIGS. 4 and 6. This embodiment differs from the first and second embodiments in the processing details in Steps S2 and S3 shown in FIG. 4. FIG. 6 is a chart showing a composite target acceleration path 602 generated by the composite target path generating section 208 of this embodiment. In FIG. 6, a target acceleration path 601 used as the reference is a triangular path. As in the cases of the first and second embodiments, the acceleration, velocity and position at the start time, at the end time of a go path, and at the end time of a return path, respectively, are defined as constraint conditions, and times T1, T2, T3, T4 and T5 and the fastest accelerations a1, a2 and a3 are calculated. Then, the composite acceleration path 602 is generated by using the calculated times T1, T2, T3, T4 and T5 and fastest accelerations a1, a2 and a3. A composite target velocity path and a composite target position path are obtained from a function obtained by integrating the composite target acceleration path in advance or by directly implementing integration. The composite target path generating section 208 outputs the composite target acceleration path 602, the composite target velocity path, and the composite target position path, which have been obtained by the calculation, as the target path 109. By the configuration as described above, even if the reference path is a triangular path, the composite paths of a reciprocating movement part are calculated whereby the target path can be generated at a high speed.

Next, the fifth embodiment of the present invention will be described with reference to FIG. 4. This embodiment differs from the first embodiment in the processing details in Steps S2 and S3 shown in FIG. 4. The composite target path generating section 208 of this embodiment generates the target path 109 in a state in which the target acceleration path used as the reference is a combination of a cycloid path, rectangular path, and triangular path. Specifically, as in the cases of the first and second embodiments, the acceleration, velocity, and position at the start time, at the end time of a go path, and at the end time of a return path, respectively, are defined as constraint conditions, and a composite target acceleration path is generated by using the times T1, T2, T3, T4 and T5 and the fastest accelerations a1, a2 and a3. A composite target velocity path and a composite target position path are obtained from a function obtained by integrating the composite target acceleration path in advance or by directly implementing integration. The composite target path generating section 208 outputs the composite target acceleration path, the composite target velocity path, and the composite target position path, which have been obtained by the calculation, as the target path 109. By the configuration as described above, even if the reference path is a composition of a cycloid path, rectangular path, and triangular path, the composite paths of a reciprocating movement part are calculated, whereby the target path can be generated at a high speed.

As described above, according to the present invention, the composite target path generating section is configured so that for a path part of reciprocating motion part of the target path indicating a motion process, the deceleration part of a go path and the acceleration part of a return path are generated as one continuous path. Therefore, the operation time of the wire bonding apparatus can be shortened, and a drive frequency can be set lower than before. As a result, the vibration mode of the XY stage and capillary, which are movable parts, is less liable to be excited, so that the wire bonding apparatus can be operated steadily.

What is claimed is:

1. A wire bonding apparatus comprising an XY axis driving mechanism for driving an XY stage, a Z axis driving mechanism for driving a capillary, and controlling means to connect a wire between an electrode on a semiconductor chip and a package by controlling said XY stage and capillary so that they go along a target path specified in advance;

wherein said apparatus further comprises a composite target path generating means for generating a composite target accelerating path as part of said target path for a reciprocating movement of either one or both of said XY stage and capillary; said composite target accelerating path including: a first wave, a second wave subsequent in time to said first wave and a third wave subsequent in time to said second wave; wherein the amplitude of said first and third waves project in a direction opposite of said second wave; said second wave being wider in width as to time scale than that of said first and third waves, such that the deceleration part of said composite target accelerating path in a go path of said reciprocating movement and the acceleration part of said composite target accelerating path in a return path of said reciprocating movement are one continuous path in said second wave.

2. The wire bonding apparatus according to claim 1, wherein a path by each of said first to third waves of said composite target acceleration path is a cycloid path of a sinusoidal wave.

3. The wire bonding apparatus according to claim 1, wherein a path by each of said first to third waves of said composite target acceleration path is a rectangular wave path.

4. The wire bonding apparatus according to claim 1, wherein a path by each of said first to third waves of said composite target acceleration path is a triangular wave path.

5. The wire bonding apparatus according to claim 1, wherein said composite target acceleration path is a continuous path formed by a combination of two or more paths of said cycloid path, rectangular wave path, and triangular wave path.

6. A wire bonding apparatus comprising:

an XY stage for movement in two dimensions; and a Z mechanism for movement in a third dimension; wherein:

said XY stage and Z mechanism attach wire bonds between an integrated chip and packaging for the integrated chip in a reciprocating movement, said reciprocating movement including a first movement and a second movement; and wherein said reciprocating movement is represented by a sinusoidal waveform graphically displaying the amplitude of the velocity of the reciprocating movement against the time of the reciprocating movement; and in which the first movement and the second movement constitute three half-cycles of the sinusoidal waveform, said second half-cycle being of lesser frequency than either the first or third half-cycles and wherein said first movement ends its movement and said second movement begins its movement during said second half-cycle.

\* \* \* \* \*